United States Patent
Madasu et al.

(10) Patent No.: US 11,643,913 B2
(45) Date of Patent: May 9, 2023

(54) HYBRID PHYSICS-BASED AND MACHINE LEARNING MODELS FOR RESERVOIR SIMULATIONS

(71) Applicant: Landmark Graphics Corporation, Houston, TX (US)

(72) Inventors: Srinath Madasu, Houston, TX (US); Keshava Prasad Rangarajan, Sugarland, TX (US)

(73) Assignee: Landmark Graphics Corporation, Houston, TX (US)

( * ) Notice: Subject to any disclaimer, the term of this patent is extended or adjusted under 35 U.S.C. 154(b) by 338 days.

(21) Appl. No.: 17/257,234

(22) PCT Filed: Apr. 30, 2019

(86) PCT No.: PCT/US2019/030059
§ 371 (c)(1),
(2) Date: Dec. 30, 2020

(87) PCT Pub. No.: WO2020/040829
PCT Pub. Date: Feb. 27, 2020

(65) Prior Publication Data
US 2021/0123334 A1    Apr. 29, 2021

Related U.S. Application Data

(60) Provisional application No. 62/720,070, filed on Aug. 20, 2018.

(51) Int. Cl.
*E21B 43/26*    (2006.01)
*G06F 30/23*    (2020.01)
(Continued)

(52) U.S. Cl.
CPC .............. *E21B 43/26* (2013.01); *E21B 44/02* (2013.01); *G06F 30/23* (2020.01); *G06F 30/27* (2020.01); *G06N 3/044* (2023.01); *G06N 3/08* (2013.01)

(58) Field of Classification Search
CPC ... E21B 43/26; E21B 2200/20; E21B 2200/22
See application file for complete search history.

(56) References Cited

U.S. PATENT DOCUMENTS

| 8,794,316 | B2 * | 8/2014 | Craig | E21B 43/26 166/250.01 |
| 9,798,042 | B2 * | 10/2017 | Johnson | G01V 1/40 |

(Continued)

FOREIGN PATENT DOCUMENTS

| WO | WO-2017151100 A1 | 9/2017 |
| WO | WO-2018106279 A1 | 6/2018 |

OTHER PUBLICATIONS

Korean Intellectual Property Office, International Search Report and Written Opinion, PCT/US2019/030059, dated Aug. 14, 2019, 11 pages, Korea.

(Continued)

*Primary Examiner* — Kenneth L Thompson
(74) *Attorney, Agent, or Firm* — Kilpatrick Townsend & Stockton LLP

(57) ABSTRACT

System and methods for simulating fluid flow during downhole operations are provided. Measurements of an operating variable at one or more locations within a formation are obtained from a downhole tool disposed in a wellbore within the formation during a current stage of a downhole operation being performed along the wellbore. The obtained measurements are applied as inputs to a hybrid model of the formation. The hybrid model includes physics-based and machine learning models that are coupled together within a simulation grid. Fluid flow within the formation is simu- (Continued)

lated, based on the inputs applied to the hybrid model. A response of the operating variable is estimated for a subsequent stage of the downhole operation along the wellbore, based on the simulation. Flow control parameters for the subsequent stage are determined based on the estimated response. The subsequent stage of the operation is performed according to the determined flow control parameters.

20 Claims, 11 Drawing Sheets

(51) Int. Cl.
*G06F 30/27* (2020.01)
*E21B 44/02* (2006.01)
*G06N 3/08* (2023.01)
*G06N 3/044* (2023.01)

(56) References Cited

U.S. PATENT DOCUMENTS

| | | | | |
|---|---|---|---|---|
| 10,012,069 | B2 * | 7/2018 | Gu | C09K 8/60 |
| 10,417,561 | B2 * | 9/2019 | Mohaghegh | G06N 3/047 |
| 10,901,105 | B2 * | 1/2021 | Halsey | G01V 1/306 |
| 10,920,552 | B2 * | 2/2021 | Rodriguez Herrera | G01V 99/005 |
| 11,225,855 | B2 * | 1/2022 | McClure | G06F 30/23 |
| 11,441,404 | B2 * | 9/2022 | Madasu | E21B 47/06 |
| 2009/0262603 | A1 | 10/2009 | Hurley et al. | |
| 2016/0312552 | A1 | 10/2016 | Early et al. | |
| 2017/0114613 | A1 * | 4/2017 | Lecerf | G06Q 10/06 |
| 2018/0230782 | A1 | 8/2018 | Pankaj et al. | |
| 2020/0371262 | A1 * | 11/2020 | McClure | E21B 41/0092 |
| 2020/0380390 | A1 * | 12/2020 | Sun | G06N 5/04 |
| 2021/0222552 | A1 * | 7/2021 | Gao | G06N 20/00 |

OTHER PUBLICATIONS

L. Lobovsky and J. Kren, Smoothed Particle Hydrodynamics Modelling of Fluids and Solids, Applied and Computational Mechanics, Sep. 16, 2007, pp. 521-530.

Connor Schenck and Dieter Fox, SPNets: Differentiable Fluid Dynamics for Deep Neural Networks, pp. 1-13.

* cited by examiner

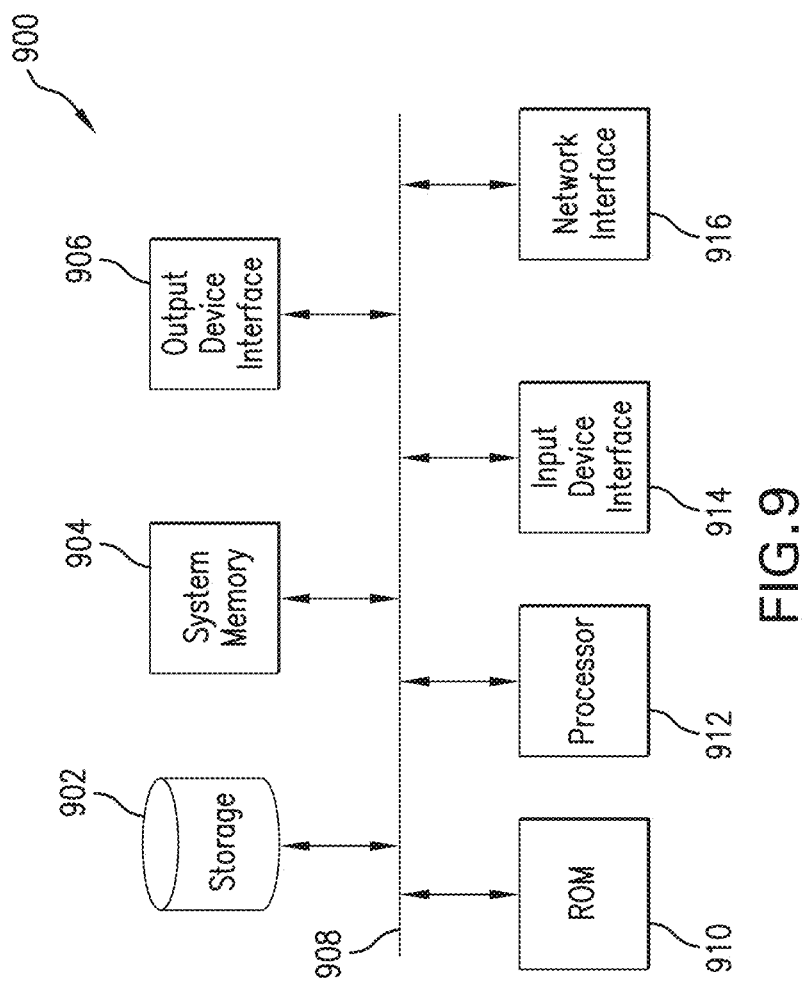

HYBRID PHYSICS-BASED AND MACHINE LEARNING MODELS FOR RESERVOIR SIMULATIONS

CROSS-REFERENCE TO RELATED APPLICATIONS

This application is a U.S. national stage patent application of International Patent Application No. PCT/US2019/030059, filed on Apr. 30, 2019, which claims priority to U.S. Provisional Application No. 62/720,070, filed on Aug. 20, 2018, the benefit of each of which is claimed and the disclosure of each of which is incorporated herein by reference in its entirety.

FIELD OF THE DISCLOSURE

The present disclosure relates generally to reservoir modeling and flow simulations for wellsite operations and particularly, to reservoir modeling and flow simulations for predicting downhole fluid behavior during wellsite operations.

BACKGROUND

Various modeling techniques are commonly used in the design and analysis of hydrocarbon exploration and production operations. For example, a geologist or reservoir engineer may use a geocellular model or other physics-based model of an underground reservoir formation to make decisions regarding the placement of production or injection wells in a hydrocarbon producing field or across a region encompassing multiple fields. In addition, such physics-based models may be used in conjunction with various numerical techniques to simulate downhole fluid behavior. The results of the simulation may then be used to estimate appropriate flow control parameters needed to optimize the distribution of fluids injected into the formation and improve hydrocarbon recovery from the formation.

The accuracy of the simulation may be dependent upon how well the underlying model is able to account for the spatial and temporal variability of the fluid flow under a given set of operating conditions. However, a physics-based model is based on assumptions and generally requires an accurate delineation of all relevant parameters affecting the flow downhole in order to effectively account for the actual physics of the fluid flow within the formation. Therefore, in cases where information relating to such downhole parameters is unavailable or incomplete, a simulation based on a physics-based model may be unreliable. Also, in cases where such information is available, the data processing requirements for the simulation may significantly reduce system performance due to the amount of information that would need to be processed.

BRIEF DESCRIPTION OF THE DRAWINGS

FIG. 9 is a block diagram of an illustrative computer system in which embodiments of the present disclosure may be implemented.

DESCRIPTION OF ILLUSTRATIVE EMBODIMENTS

Figure 1:
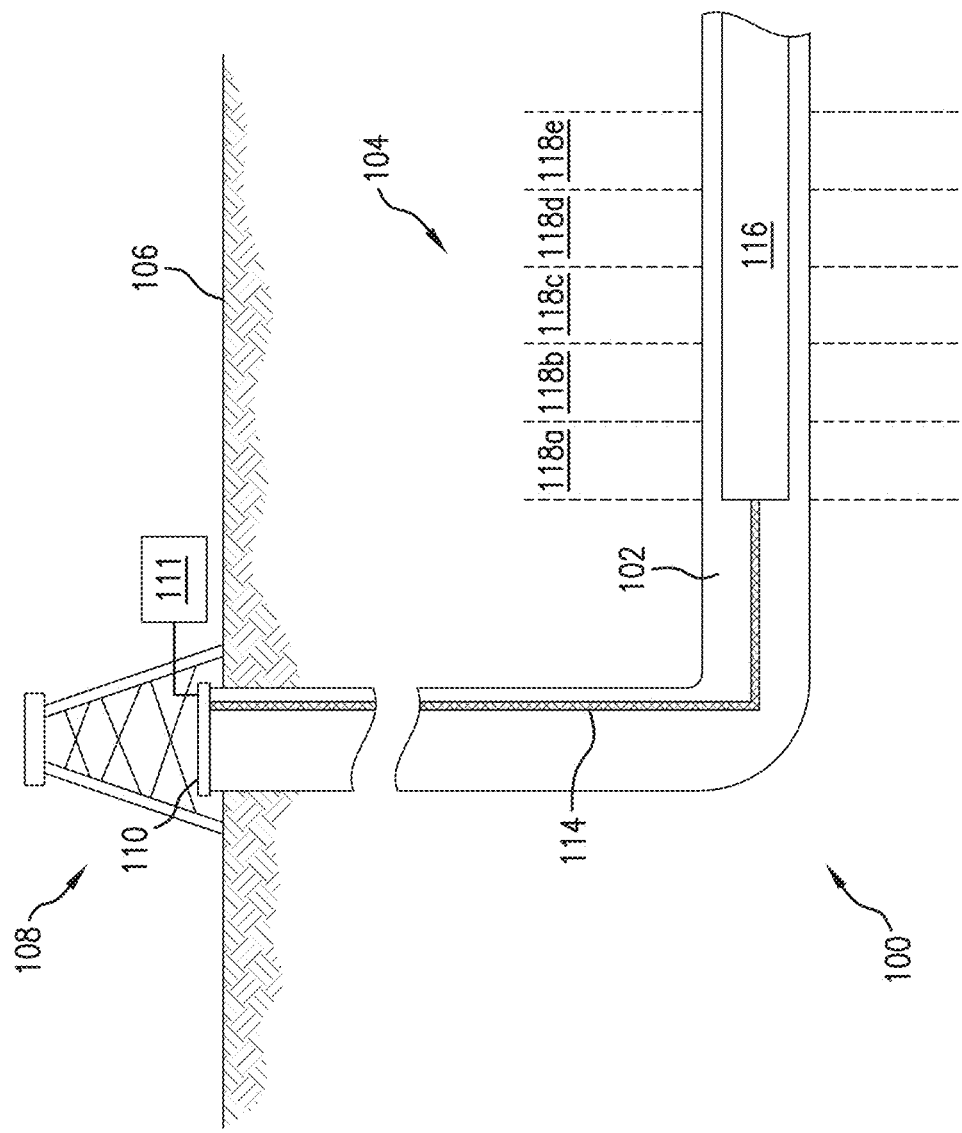
FIG. 1 is a diagram of an illustrative well system for a downhole operation along different sections of a wellbore within a subsurface reservoir formation.

Embodiments of the present disclosure relate to using hybrid reservoir simulation models, including coupled physics-based and machine-learning (ML) models, for real-time simulation and control of fluid flow during downhole operations within a subsurface reservoir formation. While the present disclosure is described herein with reference to illustrative embodiments for particular applications, it should be understood that embodiments are not limited thereto. Other embodiments are possible, and modifications can be made to the embodiments within the spirit and scope of the teachings herein and additional fields in which the embodiments would be of significant utility.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the relevant art to implement such feature, structure, or characteristic in connection with other embodiments whether or not explicitly described.

It would also be apparent to one of skill in the relevant art that the embodiments, as described herein, can be implemented in many different embodiments of software, hardware, firmware, and/or the entities illustrated in the figures. Any actual software code with the specialized control of hardware to implement embodiments is not limiting of the detailed description. Thus, the operational behavior of embodiments will be described with the understanding that modifications and variations of the embodiments are possible, given the level of detail presented herein.

Embodiments of the present disclosure may be used to make real-time operating decisions to optimize parameters of a downhole operation within a subsurface formation. For example, the downhole operation may be a stimulation treatment and the disclosed embodiments may be used to determine control parameters for optimizing the flow distribution of fluids injected into a reservoir formation at different points along a wellbore drilled within the formation. The stimulation treatment may involve injecting a treatment fluid into the formation over multiple stages to stimulate hydrocarbon production from the formation. The fluid may be injected at each stage treatment into an area of the formation via a plurality of formation entry points (or "perforation clusters") along a corresponding portion of the wellbore. In one or more embodiments, a hybrid simulation model (or "hybrid model") may be used to simulate fluid flow within the formation at each stage. The results of the simulation may then be used to estimate a response of one or more operating variables for a subsequent stage of the treatment and adjust flow control parameters in order to achieve a desired flow distribution of the fluid to be injected during the subsequent stage. While embodiments may be described in the context of a multistage hydraulic fracturing treatment, it should be appreciated that the disclosed hybrid modeling and reservoir flow simulation techniques are not intended to be limited thereto and that these techniques may be applied to other types of downhole operations, such as production and completion operations.

In one or more embodiments, the hybrid simulation model may include one or more physics-based models that are coupled with a machine learning model. Examples of such physics-based models include, but are not limited to, a finite difference (FD) model, a smoothed particle hydrodynamics (SPH) model, a Lattice Boltzmann model and similar types of physics-based models. The machine learning model may be, for example, at least one of a recurrent deep neural network (DNN) or a long short-term memory (LSTM) deep neural network model.

As will be described in further detail below, the physics-based and machine learning components of the hybrid model disclosed herein may be combined in different ways to model fluid dynamics and interactions with respect to different regions of a computational domain representing the formation. The computational domain may be, for example, a simulation grid including a plurality of cells corresponding to different formation areas. In one example, a pure DNN based proxy model may be included within the hybrid simulation model as a portion of an overall Finite Difference Reservoir Model. In another example, SPH based physics equation dynamics may be incorporated into a DNN as additional layers that enable the simulation of physical interactions with unordered particle sets. In yet another example, different regions of cells within the simulation grid may be assigned either a physics-based model, e.g., an SPH model, or a machine learning model, e.g., a DNN, for modeling heat transfer between the cells, where values of an operating variable (e.g., temperature) at locations within the cells associated with one model may be exchanged as boundary conditions for nearby cells associated with the other model via interfaces between the cells within the simulation grid.

Illustrative embodiments and related methodologies of the present disclosure are described below in reference to FIGS. 1-9 as they might be employed in, for example, a computer system for real-time monitoring and control of fluid flow during a downhole operation along a planned well path within a reservoir formation. While the following examples may be described in the context of a multistage hydraulic fracturing treatment, it should be appreciated that the disclosed hybrid modeling and reservoir flow simulation techniques are not intended to be limited thereto and that these techniques may be applied to other types of downhole operations, e.g., hydrocarbon production operations, as well as to other types of stimulation treatments, e.g., acid fracturing and matrix acidizing treatments. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented. Also, while a figure may depict a horizontal wellbore or a vertical wellbore, unless indicated otherwise, it should be understood by those skilled in the art that the apparatus according to the present disclosure is equally well suited for use in wellbores having other orientations including vertical wellbores, slanted wellbores, multilateral wellbores or the like.

FIG. 1 is a diagram illustrating an example of a well system 100 for performing a downhole operation within a hydrocarbon reservoir formation. The downhole operation may be, for example, a multistage stimulation treatment. However, it should be appreciated that embodiments of the present disclosure are not intended to be limited thereto. As shown in the example of FIG. 1, well system 100 includes a wellbore 102 in a subsurface reservoir formation 104 beneath a surface 106 of the wellsite. Wellbore 102 as shown in the example of FIG. 1 includes a horizontal wellbore. However, it should be appreciated that embodiments are not limited thereto and that well system 100 may include any combination of horizontal, vertical, slant, curved, and/or other wellbore orientations. The subsurface formation 104 may include a reservoir that contains hydrocarbon resources, such as oil, natural gas, and/or others. For example, the subsurface formation 104 may be a rock formation (e.g., shale, coal, sandstone, granite, and/or others) that includes hydrocarbon deposits, such as oil and natural gas. In some cases, the subsurface formation 104 may be a tight gas formation that includes low permeability rock (e.g., shale, coal, and/or others). The subsurface formation 104 may be composed of naturally fractured rock and/or natural rock formations that are not fractured to any significant degree.

Well system 100 also includes a fluid injection system 108 for injecting treatment fluid, e.g., hydraulic fracturing fluid, into the subsurface formation 104 over multiple sections 118a, 118b, 118c, 118d, and 118e (collectively referred to herein as "sections 118") of the wellbore 102, as will be described in further detail below. Each of the sections 118 may correspond to, for example, a different stage or interval of the multistage stimulation treatment. The boundaries of the respective sections 118 and corresponding treatment stages/intervals along the length of the wellbore 102 may be delineated by, for example, the locations of bridge plugs, packers and/or other types of equipment in the wellbore 102. Additionally or alternatively, the sections 118 and corresponding treatment stages may be delineated by particular features of the subsurface formation 104. Although five sections are shown in FIG. 1, it should be appreciated that any number of sections and/or treatment stages may be used as desired for a particular implementation. Furthermore, each of the sections 118 may have different widths or may be uniformly distributed along the wellbore 102.

As shown in FIG. 1, injection system 108 includes an injection control subsystem 111, a signaling subsystem 114 installed in the wellbore 102, and one or more injection tools 116 installed in the wellbore 102. The injection control subsystem 111 can communicate with the injection tools 116 from a surface 110 of the wellbore 102 via the signaling subsystem 114. Although not shown in FIG. 1, injection system 108 may include additional and/or different features for implementing the flow distribution monitoring and diversion control techniques disclosed herein. For example, the injection system 108 may include any number of computing subsystems, communication subsystems, pumping subsystems, monitoring subsystems, and/or other features as desired for a particular implementation. In some implementations, the injection control subsystem 111 may be communicatively coupled to a remote computing system (not shown) for exchanging information via a network for purposes of monitoring and controlling wellsite operations, including operations related to the stimulation treatment. Such a network may be, for example and without limitation, a local area network, medium area network, and/or a wide area network, e.g., the Internet.

During each stage of the stimulation treatment, the injection system 108 may alter stresses and create a multitude of fractures in the subsurface formation 104 by injecting the treatment fluid into the surrounding subsurface formation 104 via a plurality of formation entry points along a portion of the wellbore 102 (e.g., along one or more of sections 118). The fluid may be injected through any combination of one or more valves of the injection tools 116. The injection tools 116 may include numerous components including, but not limited to, valves, sliding sleeves, actuators, ports, and/or other features that communicate treatment fluid from a working string disposed within the wellbore 102 into the subsurface formation 104 via the formation entry points. The formation entry points may include, for example, open-hole sections along an encased portion of the wellbore path, a cluster of perforations along a cased portion of the wellbore path, ports of a sliding sleeve completion device along the wellbore path, slots of a perforated liner along the wellbore path, or any combination of the foregoing.

In one or more embodiments, the valves, ports, and/or other features of the injection tools 116 can be configured to control the location, rate, orientation, and/or other properties of fluid flow between the wellbore 102 and the subsurface formation 104. The injection tools 116 may include multiple tools coupled by sections of tubing, pipe, or another type of conduit. The injection tools may be isolated in the wellbore 102 by packers or other devices installed in the wellbore 102.

In some implementations, the injection system 108 may be used to create or modify a complex fracture network in the subsurface formation 104 by injecting fluid into portions of the subsurface formation 104 where stress has been altered. For example, the complex fracture network may be created or modified after an initial injection treatment has altered stress by fracturing the subsurface formation 104 at multiple locations along the wellbore 102. After the initial injection treatment alters stresses in the subterranean formation, one or more valves of the injection tools 116 may be selectively opened or otherwise reconfigured to stimulate or re-stimulate specific areas of the subsurface formation 104 along one or more sections 118 of the wellbore 102, taking advantage of the altered stress state to create complex fracture networks. In some cases, the injection system 108 may inject fluid simultaneously for multiple intervals and sections 118 of wellbore 102.

The operation of the injection tools 116 may be controlled by the injection control subsystem 111. The injection control subsystem 111 may include, for example, data processing equipment, communication equipment, and/or other systems that control injection treatments applied to the subsurface formation 104 through the wellbore 102. In one or more embodiments, the injection control subsystem 111 may receive, generate, or modify a baseline treatment plan for implementing the various stages of the stimulation treatment along the path of the wellbore 102. The baseline treatment plan may specify initial flow control parameters for injecting the treatment fluid into the subsurface formation 104. The treatment plan may also specify a baseline pumping schedule for the treatment fluid injections during each stage of the stimulation treatment.

In one or more embodiments, the injection control subsystem 111 initiates control signals to configure the injection tools 116 and/or other equipment (e.g., pump trucks, etc.) for operation based on the treatment plan. The signaling subsystem 114 as shown in FIG. 1 transmits the signals from the injection control subsystem 111 at the wellbore surface 110 to one or more of the injection tools 116 disposed in the wellbore 102. For example, the signaling subsystem 114 may transmit hydraulic control signals, electrical control signals, and/or other types of control signals. The control signals may be reformatted, reconfigured, stored, converted, retransmitted, and/or otherwise modified as needed or desired en route between the injection control subsystem 111 (and/or another source) and the injection tools 116 (and/or another destination). The signals transmitted to the injection tools 116 may control the configuration and/or operation of the injection tools 116. Examples of different ways to control the operation of each of the injection tools 116 include, but are not limited to, opening, closing, restricting, dilating, repositioning, reorienting, and/or otherwise manipulating one or more valves of the tool to modify the manner in which treatment fluid, proppant, or diverter is communicated into the subsurface formation 104. It should be appreciated that the combination of injection valves of the injection tools 116 may be configured or reconfigured at any given time during the stimulation treatment. It should also be appreciated that the injection valves may be used to inject any of various treatment fluids, proppants, and/or diverter materials into the subsurface formation 104.

In some implementations, the signaling subsystem 114 transmits a control signal to multiple injection tools, and the control signal is formatted to change the state of only one or a subset of the multiple injection tools. For example, a shared electrical or hydraulic control line may transmit a control signal to multiple injection valves, and the control signal may be formatted to selectively change the state of only one (or a subset) of the injection valves. In some cases, the pressure, amplitude, frequency, duration, and/or other properties of the control signal determine which injection tool is modified by the control signal. In some cases, the pressure, amplitude, frequency, duration, and/or other properties of the control signal determine the state of the injection tool affected by the modification.

In one or more embodiments, the injection tools 116 may include one or more sensors for collecting data relating to downhole operating conditions and formation characteristics along the wellbore 102. Such sensors may serve as real-time data sources for various types of downhole measurements and diagnostic information pertaining to each stage of the stimulation treatment. Examples of such sensors include, but are not limited to, micro-seismic sensors, tiltmeters, pressure sensors, and other types of downhole sensing equipment. The data collected downhole by such sensors may include, for example, real-time measurements and diagnostic data for monitoring the extent of fracture growth and complexity within the surrounding formation along the wellbore 102 during each stage of the stimulation treatment, e.g., corresponding to one or more sections 118. In some implementations, the injection tools 116 may include fiber-optic sensors for collecting real-time measurements of acoustic intensity or thermal energy downhole during the stimulation treatment. For example, the fiber-optic sensors may be components of a distributed acoustic sensing (DAS), distributed strain sensing, and/or distributed temperature sensing (DTS) subsystems of the injection system 108. However, it should be appreciated that embodiments are not intended to be limited thereto and that the injection tools 116 may include any of various measurement and diagnostic tools. In some implementations, the injection tools 116 may be used to inject particle tracers, e.g., tracer slugs, into the wellbore 102 for monitoring the flow distribution based on the distribution of the injected particle tracers during the treatment. For example, such tracers may have a unique temperature profile that the DTS subsystem of the injection system 108 can be used to monitor over the course of a treatment stage.

In one or more embodiments, the signaling subsystem 114 may be used to transmit real-time measurements and diagnostic data collected downhole by one or more of the aforementioned data sources to the injection control subsystem 111 for processing at the wellbore surface 110. Thus, in the fiber-optics example above, the downhole data collected by the fiber-optic sensors may be transmitted to the injection control subsystem 111 via, for example, fiber optic cables included within the signaling subsystem 114. The injection control subsystem 111 (or data processing components thereof) may use the downhole data that it receives via the signaling subsystem 114 to perform real-time fracture mapping and/or real-time fracturing pressure interpretation using any of various data analysis techniques for monitoring stress fields around hydraulic fractures.

The injection control subsystem 111 may use the real-time measurements and diagnostic data received from the data source(s) to monitor a downhole flow distribution of the treatment fluid injected into the plurality of formation entry points along the path of the wellbore 102 during each stage of the stimulation treatment. In one or more embodiments, such data may be used to simulate flow behavior of injected fluids during each treatment stage and determine flow control parameters for the next treatment stage to be performed along the wellbore 102, as will be described in further detail below.

Figure 2:
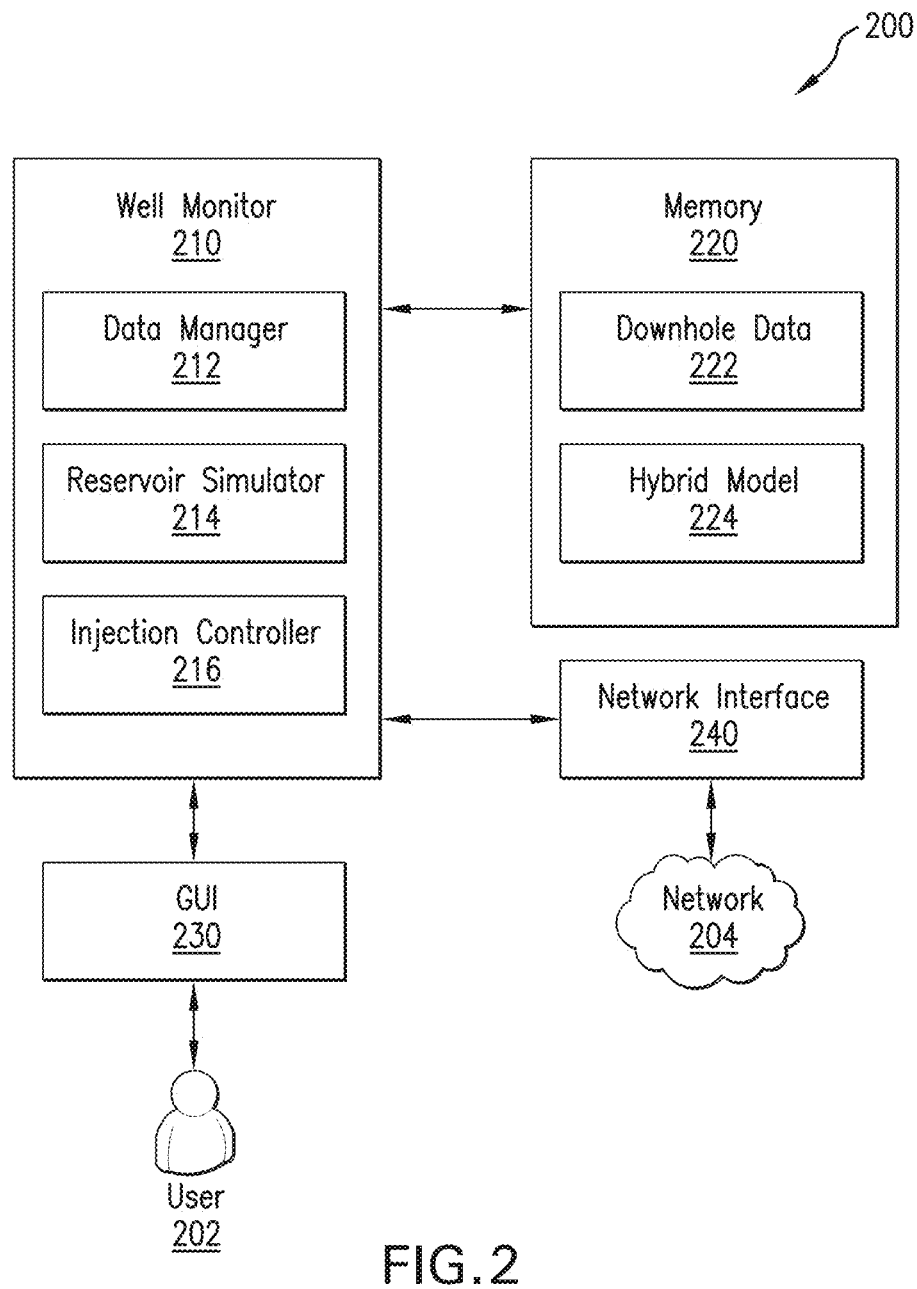
FIG. 2 is a block diagram of an illustrative system for real-time flow simulation and control of fluid injection during a multistage stimulation treatment.

FIG. 2 is a block diagram of an illustrative system 200 for real-time flow simulation and control of fluid injection during a multistage stimulation treatment. System 200 may be used to implement injection control subsystem 111 of FIG. 1, as described above. As shown in FIG. 2, system 200 includes a well monitor 210, a memory 220, a graphical user interface (GUI) 230, and a network interface 240. In one or more embodiments, well monitor 210, memory 220, GUI 230, and network interface 240 may be communicatively coupled to one another via an internal bus of system 200. Although only well monitor 210, memory 220, GUI 230, and network interface 240 are shown in FIG. 2, it should be appreciated that system 200 may include additional components, modules, and/or sub-components as desired for a particular implementation.

System 200 can be implemented using any type of computing device having at least one processor and a processor-readable storage medium for storing data and instructions executable by the processor. Examples of such a computing device include, but are not limited to, a mobile phone, a personal digital assistant (PDA), a tablet computer, a laptop computer, a desktop computer, a workstation, a server, a duster of computers, a set-top box, or other type of computing device. Such a computing device may also include an input/output (I/O) interface for receiving user input or commands via a user input device (not shown). The user input device may be, for example and without limitation, a mouse, a QWERTY or T9 keyboard, a touchscreen, a graphics tablet, or a microphone. The I/O interface also may be used by the computing device to output or present information via an output device (not shown). The output device may be, for example, a display coupled to or integrated with the computing device for displaying a digital representation of the information being presented to the user. The I/O interface in the example shown in FIG. 2 may be coupled to GUI 230 for receiving input from a user 202 and displaying information and content to user 202 based on the received input. GUI 230 can be any type of GUI display coupled to system 200.

Memory 220 may be used to store information accessible by well monitor 210 and any of its components for implementing the hybrid reservoir modeling and simulation techniques disclosed herein. As shown in the example of FIG. 2, such information may include downhole data 222 and a hybrid model 224. Memory 220 may be any type of recording medium coupled to an integrated circuit that controls access to the recording medium. The recording medium can be, for example and without limitation, a semiconductor memory, a hard disk, or similar type of memory or storage device. In some implementations, memory 220 may be a remote data store, e.g., a cloud-based storage location, communicatively coupled to system 200 over a network 204 via network interface 240. Network 204 can be any type of network or combination of networks used to communicate information between different computing devices. Network 204 can include, but is not limited to, a wired (e.g., Ethernet) or a wireless (e.g., Wi-Fi or mobile telecommunications) network. In addition, network 204 can include, but is not limited to, a local area network, medium area network, and/or wide area network such as the Internet.

In one or more embodiments, well monitor 210 includes a data manager 212, a reservoir simulator 214, and an injection controller 216. Data manager 212 may store downhole data 222 within memory 220 after obtaining the data from a downhole tool disposed in a wellbore drilled within a reservoir formation (e.g., formation 104 of FIG. 1, as described above). The downhole tool may be, for example, a measurement-while-drilling (MWD) or logging-while-drilling (LWD) tool coupled to or included within a bottom-hole assembly of a drill string disposed within the wellbore. Downhill data 222 may include real-time measurements collected by the downhole tool for at least one operating variable at one or more locations within the formation during each stage of the stimulation treatment along the wellbore.

In one or more embodiments, reservoir simulator 214 may apply the measurements collected by the downhole tool during a current stage of the treatment as inputs to hybrid model 224 for simulating fluid flow within the formation for a subsequent stage of the stimulation treatment to be performed along the wellbore. As will be described in further detail below, hybrid model 224 may be a hybrid simulation model including both physics-based and machine learning models, which are coupled together within a simulation grid representing the formation, including fractured and non-fractured portions thereof.

In one or more embodiments, injection controller 216 may estimate a response of the at least one operating variable to fluid injection within the formation during the subsequent stage of the stimulation treatment to be performed, based on the simulation performed by reservoir simulator 214. Injection controller 216 may also determine flow control parameters for the subsequent stage of the stimulation treatment to be performed, based on the estimated response. Injection controller 216 may then perform the subsequent treatment stage by injecting the fluid according to the determined flow control parameters, e.g., by sending appropriate control signals to downhole injection tools, e.g., injection tools 116 of FIG. 1, as described above, coupled to system 200 via a signaling subsystem, e.g., a signaling subsystem 114 of FIG. 1. In one or more embodiments, injection controller 216 may monitor an actual response of the injected fluid within the formation, based on additional measurements of the at least one operating variable obtained by data manager 212 as the subsequent stage of the stimulation treatment is performed along the wellbore. Hybrid model 224 may be updated if the difference between the actual response and the estimated response of the injected fluid exceeds an error tolerance threshold. The updated model may then be used by reservoir simulator 214 to perform reservoir flow simulations for subsequent treatment stages along the wellbore.

In one or more embodiments, hybrid model 224 may be based on a simulation grid generated by reservoir simulator 214. The simulation grid may include a plurality of cells corresponding different areas of the reservoir formation. In one or more embodiments, the simulation grid may define a computational domain for modeling heat transfer within different regions of the formation based on a hybrid of physics-based and machine learning models. Such a hybrid model may be generated using any of various hybrid modeling approaches that combine physics-based and machine learning models for simulating fluid interactions within the reservoir formation. Three examples of hybrid modeling approaches will be described below using the hybrid models shown in FIGS. 3A-3B. However, it should be appreciated that embodiments of the present disclosure are not intended to be limited thereto and that other approaches, including variations of the approaches described in these examples, may also be used.

Figure 3A:
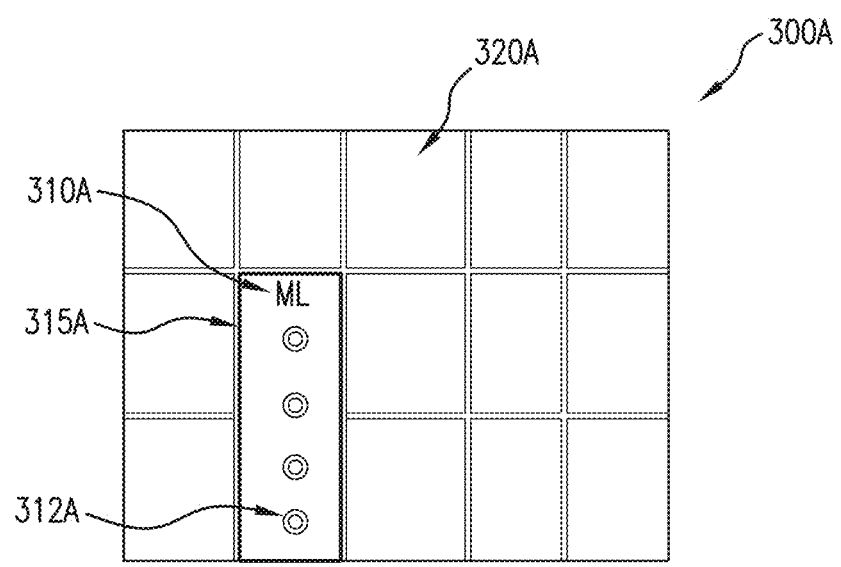
FIGS. 3A, 3B and 3C are diagrams of illustrative hybrid reservoir simulation models based on different approaches for coupling or combining physics-based and machine-learning (ML) models within a simulation grid.

FIG. 3A is a diagram illustrating an example of a hybrid model 300A including a machine-learning (ML) model 310A in a portion of an overall finite difference (FD) model 320A of a reservoir formation. In one or more embodiments, FD model 320A may be a physics-based model in the form of a simulation grid with a plurality of cells representing different regions of the formation. ML model 310A in this example may be a pure DNN based proxy model that replaces one or more cells of the simulation grid originally associated with FD model 320A. The cells associated with ML model 310A may correspond to fractured regions of the formation while the cells associated with FD model 320A may correspond to surrounding non-fractured regions of the formation. In one or more embodiments, measurements 312A of at least one operating variable may be applied as inputs to ML model 310 (or DNN portion of hybrid model 300A) for simulating fluid flow within the formation or relevant portion thereof. Measurements 312A may include, for example, values of the operating variable(s) measured in real time by a downhole tool at one or more locations or depths within the formation, e.g., during one or more stages of a stimulation treatment being performed along a wellbore (e.g., wellbore 102 of FIG. 1, as described above). Examples of such an operating variable include, but are not limited to, pressure, volume, and temperature. In one or more embodiments, hybrid model 300A may be used to model changes in the operating variable (e.g., temperature changes due to heat transfer) at an interface 315A between cells of the simulation grid associated with ML model 310 and those associated with FD model 320A. Interface 315A in this example may represent areas or locations within the cells of the simulation grid associated with one model where values of an operating variable (e.g., temperature) may be exchanged as boundary conditions for nearby cells associated with the other model. While the disclosed hybrid modeling techniques may be described in the context of modeling heat transfer, it should be appreciated that the disclosed techniques are not intended to be limited thereto and that these techniques may be applied to modeling changes in other operating variables that may affect downhole fluid dynamics.

Figure 3B:
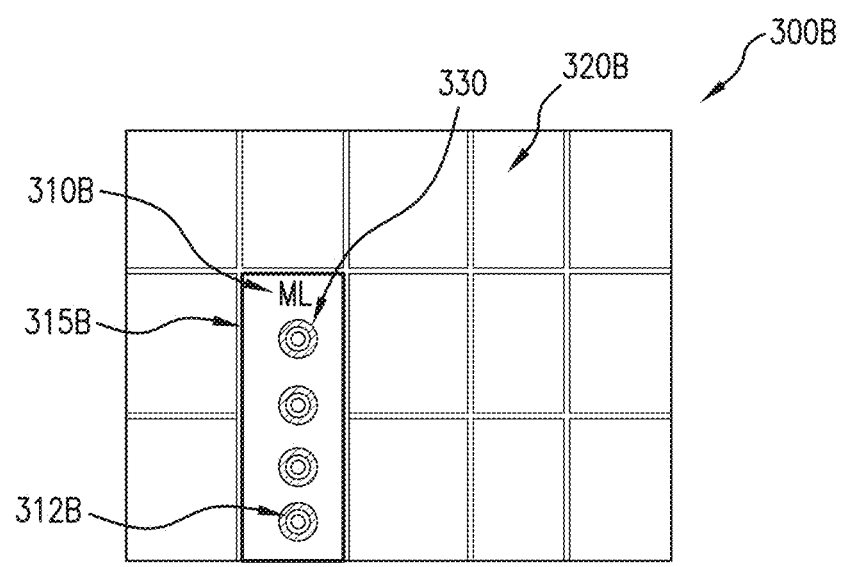

FIG. 3B is a diagram illustrating an example of a hybrid model 300B. Like hybrid model 300A of FIG. 3A, described above, hybrid model 300B includes an ML model 310B (e.g., a DNN) within a portion of a FD model 320B in the form of a simulation grid with an interface 315B between cells associated with each model. As shown in FIG. 3B, hybrid model 300B may also incorporate a physics-based SPH model and associated SPH-based physics equation dynamics as additional SPH layers 330 of the DNN/ML model 310B. Unlike conventional neural networks, which lack the functionality to interface with unordered sets of particles, the additional SPH layers 330 in the DNN/ML model 310B of hybrid model 300B enable computing physical interactions with unordered particle sets. In one or more embodiments, the SPH layers 330 added to the DNN in this example may include a convolutional SPH layer, which may be used to compute particle-particle pairwise interactions based on SPH equations, and a convolutional signed distance function (SDF) layer, which may be used to compute particle-static object interactions. These layers may be added or combined with the DNN using standard operators (e.g., element wise addition) to reproduce the SPH effects inside the DNN.

In one or more embodiments, the convolutional SPH layer (expressed as "ConvSP") of hybrid model 300B may compute particle-to-particle interactions within one or more formation regions as a smoothing kernel over a set of particles, e.g., using Equation (1) as follows:

$$\mathrm{Conv}SP(X,Y) = \{\Sigma_{j \in x} y_j W(d_{ij}, h) \| i \in X\} \quad (1)$$

where i and j represent different particles, X is the set of particle locations, Y is a corresponding set of feature vectors, $y_j$=is the feature vector in Y associated with particle j, W is a kernel function, $d_{ij}$ is the distance between particles i and j, and h is the cutoff radius.

In one or more embodiments, the convolutional SDF layer (expressed as "ConvSDF") of hybrid model 300B may compute particle-to-static object interactions within the formation region(s), e.g., using Equation (2) as follows:

$$\mathrm{Conv}SDF(X) = \left\{ \sum_{k \in K} w_k \min_j SDF_j(p_i + k*d) \middle| i \in X \right\} \quad (2)$$

where $w_k$ is the weight associated with kernel cell k, K is the set of offsets for a given convolutional kernel, $p_i$ is the location of particle i, $SDF_j$ is the jth SDF in the scene, and d is the dilation of the kernel.

Figure 3C:
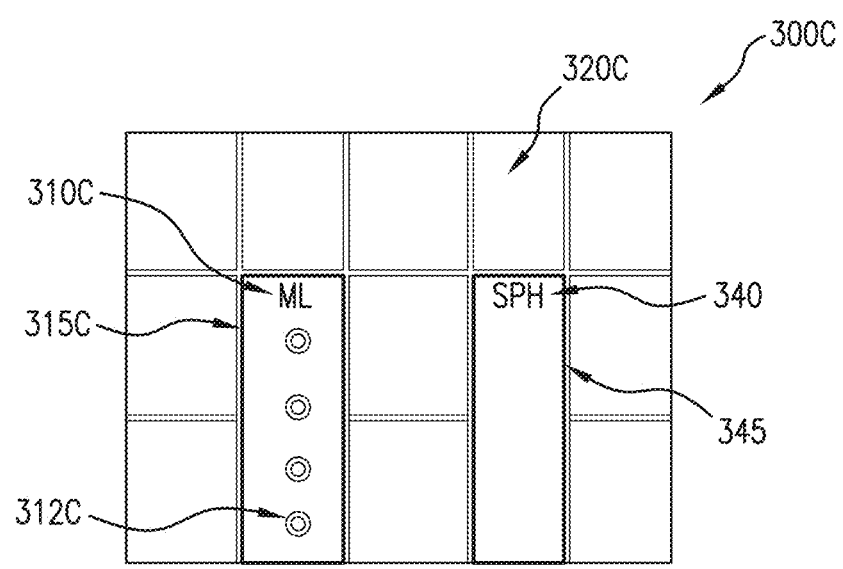

FIG. 3C is a diagram of an illustrative hybrid model 300C including coupled physics-based and machine-learning models for different regions of a simulation grid. As described above, different regions of cells within the simulation grid may be assigned either a physics-based model (e.g., a FD model 320C or an SPH model 340) or a machine learning model 310C (e.g., a DNN incorporating measurements 312C) for modeling heat transfer or other changes affecting fluid dynamics between the cells (e.g., within interface areas 315C and 345), where values of an operating variable (e.g., temperature) at locations within the cells associated with one model may be exchanged as boundary conditions for nearby cells associated with the other model via interfaces between the cells within the simulation grid.

In one or more embodiments, heat transfer within cells of the simulation grid associated with the FD model in a hybrid model, e.g., any of hybrid models 300A, 300B and 300C shown in FIGS. 3A, 3B and 3C, respectively, may be modeled using a steady state two-dimensional (2D) heat transfer model, e.g., as expressed by Equation (3):

$$\frac{\partial^2 T}{\partial x^2} + \frac{\partial^2 T}{\partial y^2} = 0 \quad (3)$$

where T is temperature, x and y are spatial locations.

Figure 4:
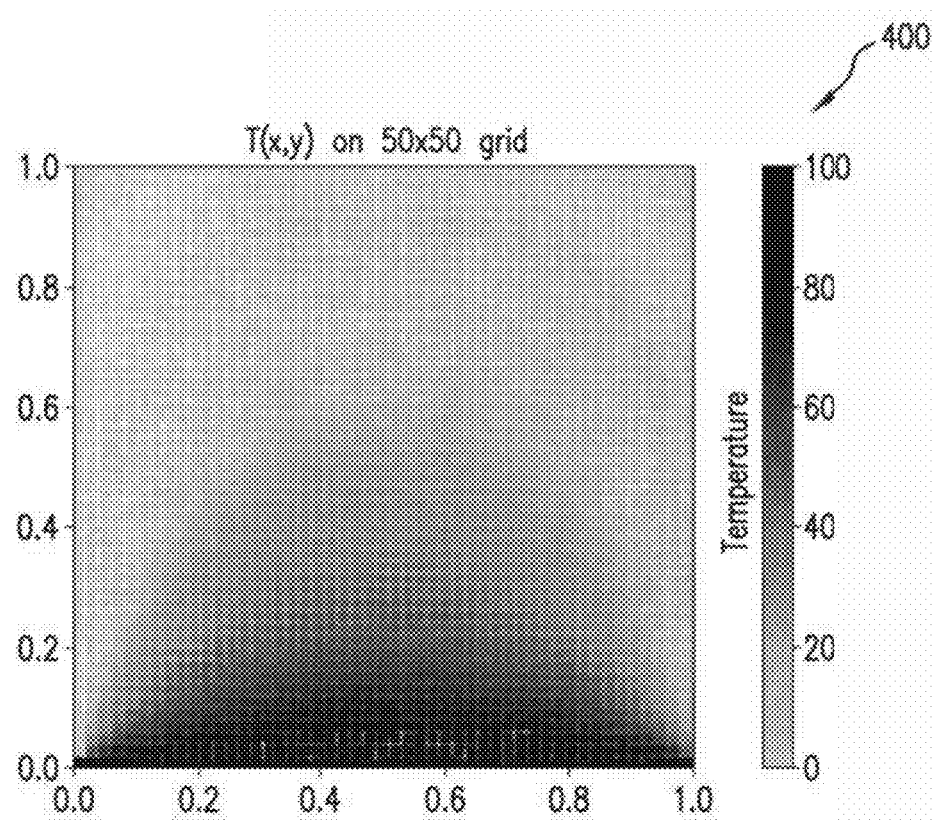
FIG. 4 is a grid of temperature values illustrating an example of a finite difference solution for two-dimensional (2D) heat transfer within a reservoir formation.

Equation (3) may be solved using a finite difference technique with boundary conditions for the operating variable (temperature in this example) set to T=100 and T=0. An example of the computational results that may be derived from solving Equation (3) with these boundary conditions is shown in FIG. 4. In FIG. 4, a grid 400 of temperature values illustrates an example of the finite difference solution for the 2D heat transfer of fluid particles within a cell of the hybrid model (or portion thereof) that is associated with the FD model as a function of locations (x) and (y). For example, grid 400 may represent a portion of a cell corresponding to the FD portion of an interface between the FD model and the ML or SPH model within the hybrid model.

For cells of the hybrid model corresponding to fractured regions of the formation, a one-dimensional (1D) heat transfer equation may be solved to model or simulate the heat transfer inside the fractures using an SPH model, an ML model (e.g., a DNN), or some combination thereof (e.g., as in hybrid models 300B and 300C of FIGS. 3B and 3C, respectively, as described above). For example, in hybrid model 300C of FIG. 3C, SPH model 340 and ML model 310C may exchange boundary conditions with FD model 320C at interfaces 315C and 345 between these models within hybrid model 300C.

Figure 5:
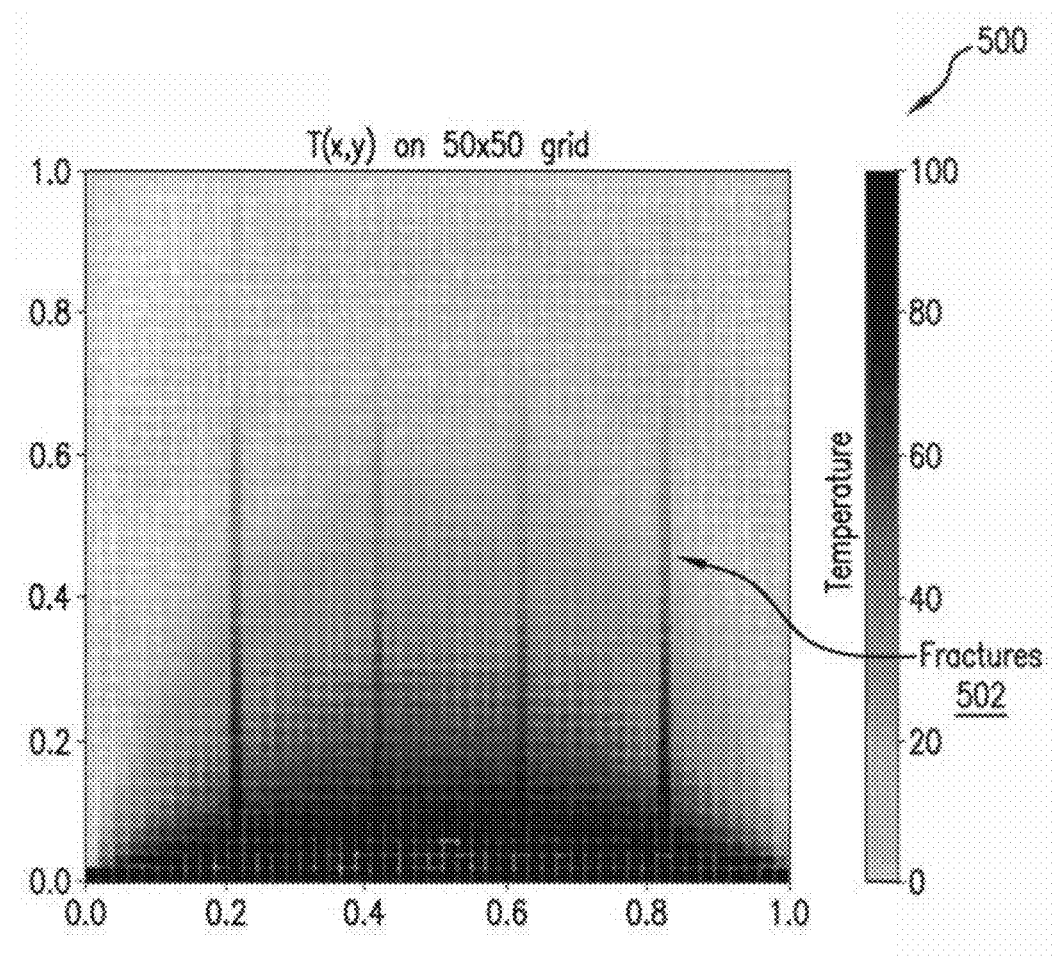
FIG. 5 is another grid of temperature values illustrating an example of a coupled finite difference and smoothed-particle hydrodynamics (SPH) solution for heat transfer between fractured and non-fractured regions of the reservoir formation.

FIG. 5 is a grid 500 showing an example of the computational results that may be derived for heat transfer within the coupled FD and SPH regions of such a hybrid model. The SPH regions in this example may correspond to fractures 502 within the formation being modeled. Accordingly, the heat transfer inside fractures 502 may be simulated using a 1D SPH model of the hybrid model, e.g., based on a corresponding 1D heat transfer equation, as described above.

Figure 6:
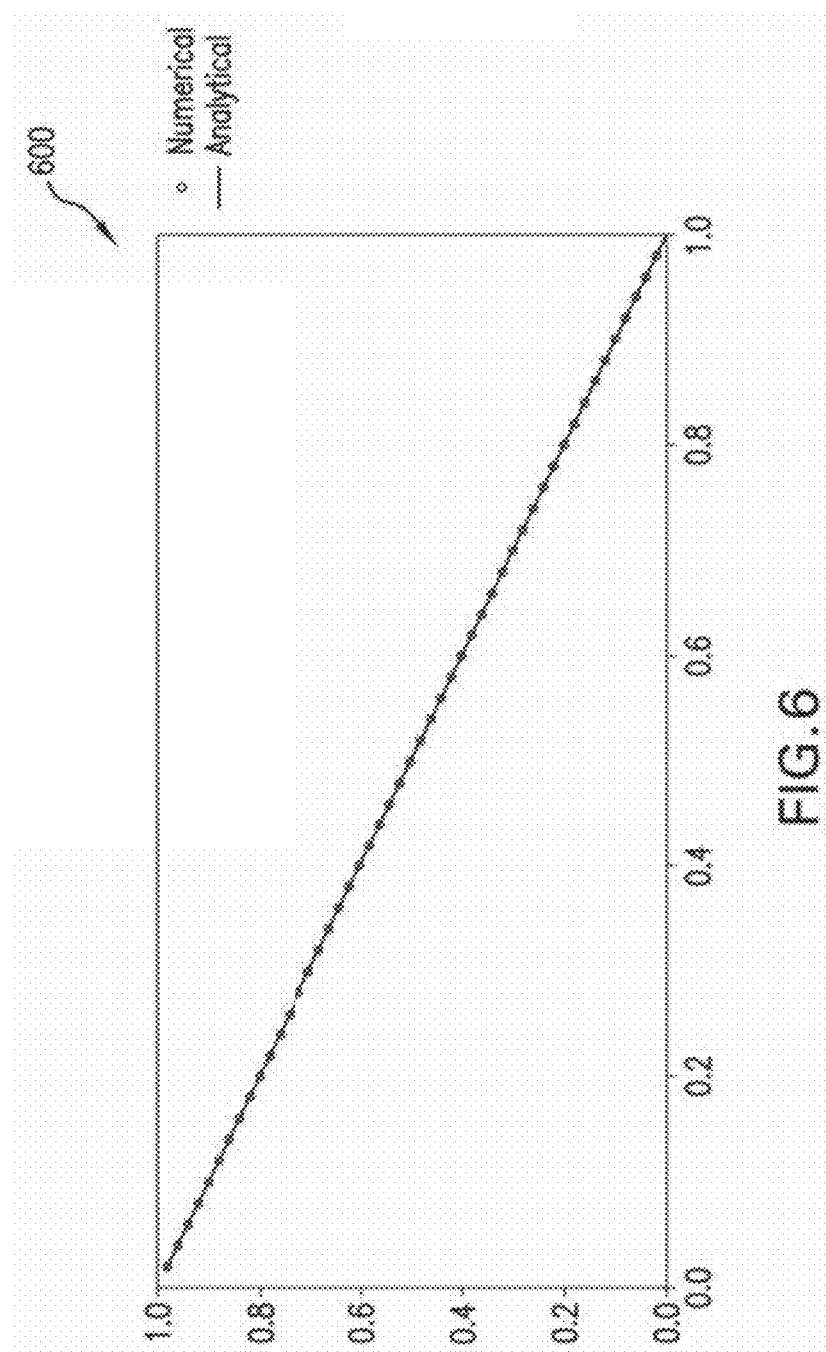
FIG. 6 is a plot graph showing a comparison between an ML-based numerical solution and an analytical solution for one-dimensional (1D) heat transfer within fractured regions of the reservoir formation.

FIG. 6 is a plot graph 600 that shows a comparison between a numerical solution based on a hybrid model, e.g., hybrid model 300B of FIG. 3B, including a physics-based model (e.g., SPH model 330) within an ML model (e.g., ML model 310B) and an analytical solution (e.g., based on T=100(1−x)). The numerical solution may be determined based on modified a cost function, an example of which will be described in further detail below using Equation (4). As shown in FIG. 6, the solutions match one other very well, which confirms that the physics-based model can be solved effectively inside a ML framework.

Figure 7:
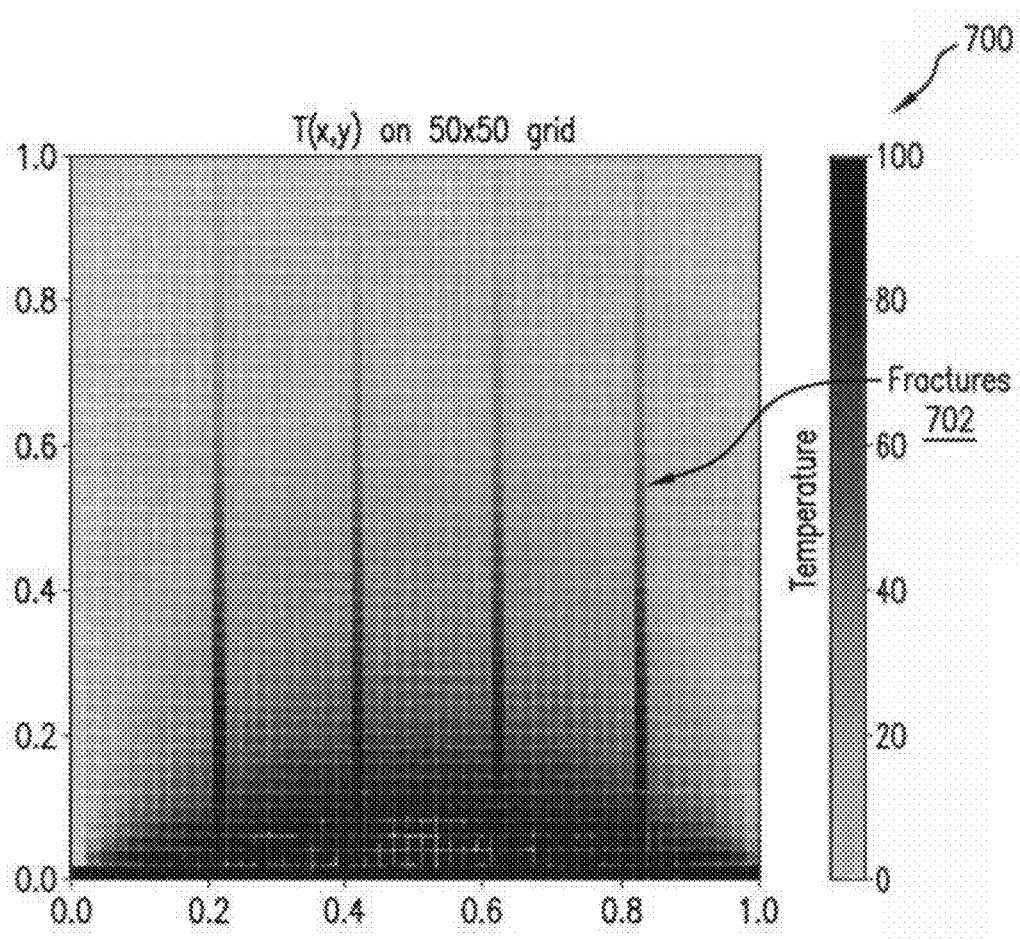
FIG. 7 is yet another grid of temperature values illustrating an example of a coupled finite difference and machine learning solution for heat transfer between fractured and non-fractured regions of the reservoir formation.

FIG. 7 shows the computational results from modeling heat transfer in fractured regions of a reservoir formation represented by a hybrid model. The fractured regions in this example may be a set of fractures 702 corresponding to an interface between coupled FD and ML models of the hybrid model (e.g., interface 315B of hybrid model 300B in FIG. 3B, as described above). In one or more embodiments, the heat transfer inside fractures 702 may be simulated using a 1D ML model of the hybrid model. Furthermore, a physics-based model (or corresponding 1D heat transfer equation) of the hybrid model (e.g., SPH model 330 of hybrid model 300B in FIG. 3B) may be solved inside the DNN or ML model (e.g., ML-model 310B of hybrid model 300B) by modifying a cost function, e.g., as expressed by Equation (4):

$$\cost = \left|\frac{\partial T}{\partial y^2}\right|^2 + |T_{y=0} - 100|^2 + |T_{y=1} - 0|^2 + |T - T_{measured}|^2 \quad (4)$$

The inputs to the ML model according to Equation (4) above may include calculated or measured temperature values (T or $T_{measured}$) as a function of location (y). In one or more embodiments, the cost function of the ML model may be modified to include a hybrid formation based on one or more SPH equations. Such a formulation improves over conventional physics-based models by accounting for both the actual physics and various assumptions, e.g., based on empirical or statistical analysis.

In one or more embodiments, a one-dimensional (1D) SPH formulation of a cost function may be expressed using Equation (5):

$$SPH = \Sigma_j 2 * m_j / \rho_i \rho_j wg * (T_i - T_j) / r_{ij} \quad (5)$$

where i and j represent different fluid particles, $m_j$ is the mass of particle j, wg is the gradient of a weighting function (e.g., based on a cubic spline), $r_{ij}$ is the distance between particles i and j, T is the temperature, and parameters $\rho_i$ and $\rho_j$ are the densities of the respective particles i and j.

Figure 8:
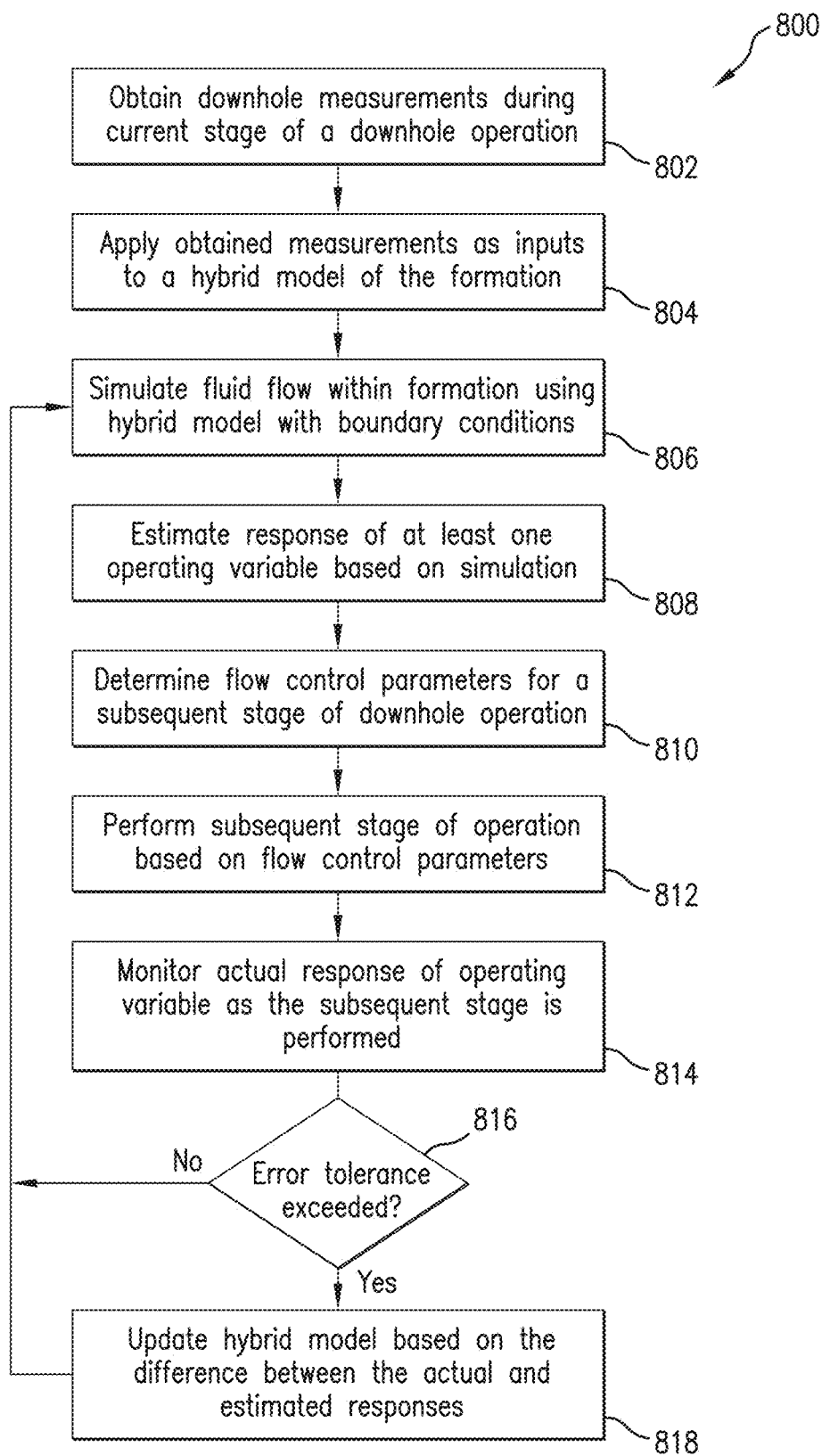
FIG. 8 is a flowchart of an illustrative process of simulating flow of fluids for a downhole operation within a reservoir formation based on a hybrid simulation model including coupled physics-based and machine learning models.

FIG. 8 is a flowchart of an illustrative process 800 for simulating flow of injected fluids for a downhole operation within a reservoir formation based on a hybrid simulation model including coupled physics-based and machine learning models. The downhole operation may be, for example, a multistage stimulation treatment, as described above. However, it should be appreciated that embodiments of the present disclosure are not intended to be limited thereto. While process 800 will be described with reference to well system 100 of FIG. 1, as described above, it should be appreciated that process 800 is not intended to be limited thereto.

Process 800 begins in block 802, which includes obtaining downhole measurements of an operating variable at one or more locations within the formation during a current stage of a downhole operation a multistage stimulation treatment, as described above) being performed along a wellbore (e.g., wellbore 102 of FIG. 1 as described above) drilled within the formation. The measurements may be obtained from a downhole tool (e.g., one or more sensors within injection tools 116 of FIG. 1, as described above) disposed in the wellbore.

In block 804, the obtained measurements may be applied as inputs to a hybrid model of the formation. The hybrid model may include physics-based and machine learning models that are coupled together within a simulation grid, as described above.

Process 800 then proceeds to block 806, which includes simulating fluid flow within the formation, based on the inputs applied to the hybrid model.

In block 808, a response of the operating variable is estimated for a subsequent stage of the downhole operation to be performed along the wellbore, based on the simulation.

In block 810, flow control parameters are determined for the subsequent stage of the downhole operation, based on the estimated response.

The subsequent stage of the downhole operation is performed in block 812 according to the determined flow control parameters.

In block 814, an actual response of the operating variable is monitored, based on additional measurements obtained from the downhole tool as the subsequent stage of the downhole operation is performed along the wellbore.

Upon determining in block 816 that a difference between the actual response and the estimated response exceeds an error tolerance threshold, process 800 proceeds to block 818, which includes updating the hybrid model based on the difference and thereafter, returning to block 806 to simulate fluid flow for another stage of the downhole operation using the updated hybrid model. Otherwise, process 800 returns directly to block 806 to simulate fluid flow using the original hybrid model.

FIG. 9 is a block diagram of an illustrative computer system 900 in which embodiments of the present disclosure may be implemented. For example, process 800 of FIG. 8 and the functions performed by injection subsystem 111 of FIG. 1 and system 200 (including well monitor 210) of FIG. 2, as described above, may be implemented using system 900. System 900 can be a computer, phone, PDA, or any other type of electronic device. Such an electronic device includes various types of computer readable media and interfaces for various other types of computer readable media. As shown in FIG. 9, system 900 includes a permanent storage device 902, a system memory 904, an output device interface 906, a system communications bus 908, a read-only memory (ROM) 910, processing unit(s) 912, an input device interface 914, and a network interface 916.

Bus 908 collectively represents all system, peripheral, and chipset buses that communicatively connect the numerous internal devices of system 900. For instance, bus 908 communicatively connects processing unit(s) 912 with 910, system memory 904, and permanent storage device 902.

From these various memory units, processing unit(s) 912 retrieves instructions to execute and data to process in order to execute the processes of the subject disclosure. The processing unit(s) can be a single processor or a multi-core processor in different implementations.

ROM 910 stores static data and instructions that are needed by processing t(s) 912 and other modules of system 900. Permanent storage device 902, on the other hand, is a read-and-write memory device. This device is a non-volatile memory unit that stores instructions and data even when system 900 is powered off. Some implementations of the subject disclosure use a mass-storage device (such as a magnetic or optical disk and its corresponding disk drive) as permanent storage device 902.

Other implementations use a removable storage device (such as a floppy disk, flash drive, and its corresponding disk drive) as permanent storage device 902. Like permanent storage device 902, system memory 904 is a read-and-write memory device. However, unlike storage device 902, system memory 904 is a volatile read-and-write memory, such a random access memory. System memory 904 stores some of the instructions and data that the processor needs at runtime. In some implementations, the processes of the subject disclosure are stored in system memory 904, permanent storage device 902, and/or ROM 910. For example, the various memory units include instructions for computer aided pipe string design based on existing string designs in accordance with some implementations. From these various memory units, processing unit(s) 912 retrieves instructions to execute and data to process in order to execute the processes of some implementations.

Bus 908 also connects to respective input and output device interfaces 914 and 906. Input device interface 914 enables the user to communicate information and select commands to the system 900. Input devices used with input device interface 914 include, for example, alphanumeric, QWERTY, or T9 keyboards, microphones, and pointing devices (also called "cursor control devices"). Output device interfaces 906 enables, for example, the display of images generated by the system 900. Output devices used with output device interface 906 include, for example, printers and display devices, such as cathode ray tubes (CRT) or liquid crystal displays (LCD). Some implementations include devices such as a touchscreen that functions as both input and output devices. It should be appreciated that embodiments of the present disclosure may be implemented using a computer including any of various types of input and output devices for enabling interaction with a user. Such interaction may include feedback to or from the user in different forms of sensory feedback including, but not limited to, visual feedback, auditory feedback, or tactile feedback. Further, input from the user can be received in any form including, but not limited to, acoustic, speech, or tactile input. Additionally, interaction with the user may include transmitting and receiving different types of information, e.g., in the form of documents, to and from the user via the above-described interfaces.

Also, as shown in FIG. 9, bus 908 also couples system 900 to a public or private network (not shown) or combination of networks through a network interface 916. Such a network may include, for example, a local area network ("LAN"), such as an Intranet, or a wide area network ("WAN"), such as the Internet. Any or all components of system 900 can be used in conjunction with the subject disclosure.

These functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include R. ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself. Accordingly, process 800 of FIG. 8 and the functions or operations performed by injection subsystem 111 of FIG. 1 and system 200 of FIG. 2, as described above, may be implemented using system 900 or any computer system having processing circuitry or a computer program product including instructions stored therein, which, when executed by at least one processor, causes the processor to perform functions relating to these methods.

As used in this specification and any claims of this application, the terms "computer", "server", "processor", and "memory" all refer to electronic or other technological devices. These terms exclude people or groups of people. As used herein, the terms "computer readable medium" and "computer readable media" refer generally to tangible, physical, and non-transitory electronic storage mediums that store information in a form that is readable by a computer.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., a web page) to a client device (e.g., for purposes of displaying data to and receiving user input from a user interacting with the client device). Data generated at the client device (e.g., a result of the user interaction) can be received from the client device at the server.

It is understood that any specific order or hierarchy of steps in the processes disclosed is an illustration of exemplary approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Furthermore, the exemplary methodologies described herein may be implemented by a system including processing circuitry or a computer program product including instructions which, when executed by at least one processor, causes the processor to perform any of the methodology described herein.

Embodiments of the present disclosure are particularly useful for simulating fluid flow during downhole operations using hybrid formation models including coupled physics-based and machine learning models. As described above, a computer-implemented method of simulating fluid flow during downhole operations may include: obtaining, by a computer system from a downhole tool disposed in a wellbore within a formation, measurements of an operating variable at one or more locations within the formation during a current stage of a downhole operation being performed along the wellbore; applying the obtained measurements as inputs to a hybrid model of the formation, the hybrid model including physics-based and machine learning models that are coupled together within a simulation grid; simulating fluid flow within the formation, based on the inputs applied to the hybrid model; estimating a response of the operating variable for a subsequent stage of the downhole operation to be performed along the wellbore, based on the simulation; determining flow control parameters for the subsequent stage of the downhole operation to be performed, based on the estimated response; and performing the subsequent stage of the downhole operation according to the determined flow control parameters.

Also, a computer-readable storage medium with instructions stored therein has been described, where the instructions when executed by a computer cause the computer to perform a plurality of functions, including functions to: obtain, from a downhole tool disposed in a wellbore within a formation, measurements of an operating variable at one or more locations within the formation during a current stage of a downhole operation being performed along the wellbore; apply the obtained measurements as inputs to a hybrid model of the formation, the hybrid model including physics-based and machine learning models that are coupled together within a simulation grid; simulate fluid flow within the formation, based on the inputs applied to the hybrid model; estimate a response of the operating variable for a subsequent stage of the downhole operation to be performed along the wellbore, based on the simulation; determine flow control parameters for the subsequent stage of the downhole operation to be performed, based on the estimated response; and perform the subsequent stage of the downhole operation according to the determined flow control parameters.

In one or more embodiments of the foregoing method or computer-readable storage medium, the downhole operation may be a stimulation treatment, and applying the obtained measurements may comprise: determining whether the one or more locations at which the measurements were obtained correspond to a fracture within the formation; when it is determined that the one or more locations correspond to a fracture within the formation, designating one or more of the plurality of cells corresponding to the one or more locations within the simulation grid as a fractured region of the hybrid model and assigning at least one of a physics-based model or a machine learning model to the fractured region within the simulation grid; and when it is determined that the one or more locations do not correspond to a fracture within the formation, designating one or more of the plurality of cells corresponding to the one or more locations within the simulation grid as a non-fractured region of the hybrid model. Also, for the foregoing embodiments, the physics-based model may be at least one of a finite difference (FD) model or a smoothed particle hydrodynamics (SPH) model, the machine learning model may be a neural network, the neural network may be at least one of a recurrent deep neural network (DNN) or a long short-term memory (LSTM) deep neural network.

Further, such embodiments may include any one of the following functions, operations or elements, alone or in combination with each other: monitoring an actual response of the operating variable, based on additional measurements obtained from the downhole tool as the subsequent stage of the downhole operation is performed along the wellbore, and upon determining that a difference between the actual response and the estimated response exceeds an error tolerance threshold, updating the hybrid model based on the difference; applying the obtained measurements to the hybrid model by training the neural network to estimate the response of the one or more operating variables to fluid injection, based on a portion of the measurements obtained during the current stage of the stimulation treatment and a cost function associated with each of the one or more operating variables, determining an actual response of the one or more operating variables, based on additional measurements obtained during the subsequent stage of the stimulation treatment along the wellbore, determining whether a difference between the actual response and the estimated response exceeds an error tolerance threshold, and retraining the neural network using the additional measurements when the difference is determined to exceed the error tolerance threshold; retraining the neural network by applying Bayesian optimization to retrain the neural network over a plurality of iterations until a predetermined convergence criterion is met; and determining boundary conditions for an interface between the fractured and non-fractured regions of the hybrid model, wherein the fluid flow is simulated for the subsequent stage of the downhole operation, based on the determined boundary conditions.

Furthermore, a system has been described, which includes a processor and a memory coupled to the processor that has instructions stored therein, which, when executed by the processor, cause the processor to perform a plurality of functions, including functions to: obtain, from a downhole tool disposed in a wellbore within a formation, measurements of an operating variable at one or more locations within the formation during a current stage of a downhole operation being performed along the wellbore; apply the obtained measurements as inputs to a hybrid model of the formation, the hybrid model including physics-based and machine learning models that are coupled together within a simulation grid; simulate fluid flow within the formation, based on the inputs applied to the hybrid model; estimate a response of the operating variable for a subsequent stage of the downhole operation to be performed along the wellbore, based on the simulation; determine flow control parameters for the subsequent stage of the downhole operation to be performed, based on the estimated response; and perform the subsequent stage of the downhole operation according to the determined flow control parameters.

In one or more embodiments of the foregoing system, the downhole operation may be a stimulation treatment, and applying the obtained measurements may comprise: determining whether the one or more locations at which the measurements were obtained correspond to a fracture within the formation; when it is determined that the one or more locations correspond to a fracture within the formation, designating one or more of the plurality of cells corresponding to the one or more locations within the simulation grid as a fractured region of the hybrid model and assigning at least one of a physics-based model or a machine learning model to the fractured region within the simulation grid; and when it is determined that the one or more locations do not correspond to a fracture within the formation, designating one or more of the plurality of cells corresponding to the one or more locations within the simulation grid as a non-fractured region of the hybrid model. Also, for the foregoing embodiments, the physics-based model may be at least one of a finite difference (FD) model or a smoothed particle hydrodynamics (SPH) model, the machine learning model may be a neural network, the neural network may be at least one of a recurrent deep neural network (DNN) or a long short-term memory (LSTM) deep neural network.

Further, such embodiments of the system may include any one of the following functions, operations or elements, alone or in combination with each other: monitoring an actual response of the operating variable, based on additional measurements obtained from the downhole tool as the subsequent stage of the downhole operation is performed along the wellbore, and upon determining that a difference between the actual response and the estimated response exceeds an error tolerance threshold, updating the hybrid model based on the difference; applying the obtained measurements to the hybrid model by training the neural network to estimate the response of the one or more operating variables to fluid injection, based on a portion of the measurements obtained during the current stage of the stimulation treatment and a cost function associated with each of the one or more operating variables, determining an actual response of the one or more operating variables, based on additional measurements obtained during the subsequent stage of the stimulation treatment along the wellbore, determining whether a difference between the actual response and the estimated response exceeds an error tolerance threshold, and retraining the neural network using the additional measurements when the difference is determined to exceed the error tolerance threshold; retraining the neural network by applying Bayesian optimization to retrain the neural network over a plurality of iterations until a predetermined convergence criterion is met; and determining boundary conditions for an interface between the fractured and non-fractured regions of the hybrid model, wherein the fluid flow is simulated for the subsequent stage of the downhole operation, based on the determined boundary conditions.

While specific details about the above embodiments have been described, the above hardware and software descriptions are intended merely as example embodiments and are not intended to limit the structure or implementation of the disclosed embodiments. For instance, although many other internal components of the system 900 are not shown, those of ordinary skill in the art will appreciate that such components and their interconnection are well known.

In addition, certain aspects of the disclosed embodiments, as outlined above, may be embodied in software that is executed using one or more processing units/components:

Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present disclosure. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The above specific example embodiments are not intended to limit the scope of the claims. The example embodiments may be modified by including, excluding, or combining one or more features or functions described in the disclosure.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and explanation but is not intended to be exhaustive or limited to the embodiments in the form disclosed. Many modifications and variations will be apparent to those of ordinary skill in the art without departing from the scope and spirit of the disclosure. The illustrative embodiments described herein are provided to explain the principles of the disclosure and the practical application thereof and to enable others of ordinary skill in the art to understand that the disclosed embodiments may be modified as desired for a particular implementation or use. The scope of the claims is intended to broadly cover the disclosed embodiments and any such modification.

What is claimed is:

1. A computer-implemented method of simulating fluid flow during downhole operations, the method comprising:
obtaining, by a computer system from a downhole tool disposed in a wellbore within a formation, measurements of an operating variable at one or more locations within the formation during a current stage of a downhole operation being performed along the wellbore;
applying the obtained measurements as inputs to a hybrid model of the formation, the hybrid model including physics-based and machine learning models that are coupled together within a simulation grid;
simulating fluid flow within the formation, based on the inputs applied to the hybrid model;
estimating a response of the operating variable for a subsequent stage of the downhole operation to be performed along the wellbore, based on the simulation;
determining flow control parameters for the subsequent stage of the downhole operation to be performed, based on the estimated response; and
performing the subsequent stage of the downhole operation according to the determined flow control parameters.

2. The method of claim 1, further comprising:
monitoring an actual response of the operating variable, based on additional measurements obtained from the downhole tool as the subsequent stage of the downhole operation is performed along the wellbore; and
upon determining that a difference between the actual response and the estimated response exceeds an error tolerance threshold, updating the hybrid model based on the difference.

3. The method of claim 1, wherein the downhole operation is a stimulation treatment, and applying the obtained measurements comprises:
determining whether the one or more locations at which the measurements were obtained correspond to a fracture within the formation;
when it is determined that the one or more locations correspond to a fracture within the formation:
designating one or more of a plurality of cells corresponding to the one or more locations within the simulation grid as a fractured region of the hybrid model; and
assigning at least one of a physics-based model or a machine learning model to the fractured region within the simulation grid; and
when it is determined that the one or more locations do not correspond to a fracture within the formation, designating one or more of the plurality of cells corresponding to the one or more locations within the simulation grid as a non-fractured region of the hybrid model.

4. The method of claim 3, wherein the physics-based model is at least one of a finite difference (FD) model or a smoothed particle hydrodynamics (SPH) model.

5. The method of claim 3, wherein the machine learning model is a neural network.

6. The method of claim 5, wherein the neural network is at least one of a recurrent deep neural network (DNN) or a long short-term memory (LSTM) deep neural network.

7. The method of claim 5, wherein applying the obtained measurements to the hybrid model comprises:
training the neural network to estimate the response of the one or more operating variables to fluid injection, based on a portion of the measurements obtained during the current stage of the stimulation treatment and a cost function associated with each of the one or more operating variables;
determining an actual response of the one or more operating variables, based on additional measurements obtained during the subsequent stage of the stimulation treatment along the wellbore;

determining whether a difference between the actual response and the estimated response exceeds an error tolerance threshold; and when the difference is determined to exceed the error tolerance threshold, retraining the neural network using the additional measurements.

8. The method of claim 7, wherein the retraining comprises:

applying Bayesian optimization to retrain the neural network over a plurality of iterations until a predetermined convergence criterion is met.

9. The method of claim 7, further comprising:

determining boundary conditions for an interface between the fractured and non-fractured regions of the hybrid model, wherein the fluid flow is simulated for the subsequent stage of the downhole operation, based on the determined boundary conditions.

10. A system comprising:

a processor; and a memory coupled to the processor, the memory having instructions stored therein, which, when executed by the processor, cause the processor to perform a plurality of functions, including functions to:

obtain, from a downhole tool disposed in a wellbore within a formation, measurements of an operating variable at one or more locations within the formation during a current stage of a downhole operation being performed along the wellbore;

apply the obtained measurements as inputs to a hybrid model of the formation, the hybrid model including physics-based and machine learning models that are coupled together within a simulation grid;

simulate fluid flow within the formation, based on the inputs applied to the hybrid model;

estimate a response of the operating variable for a subsequent stage of the downhole operation to be performed along the wellbore, based on the simulation;

determine flow control parameters for the subsequent stage of the downhole operation to be performed, based on the estimated response; and perform the subsequent stage of the downhole operation according to the determined flow control parameters.

11. The system of claim 10, wherein the functions performed by the processor further include functions to:

monitor an actual response of the operating variable, based on additional measurements obtained from the downhole tool as the subsequent stage of the downhole operation is performed along the well bore;

determine whether a difference between the actual response and the estimated response exceeds an error tolerance threshold; and when a difference between the actual response and the estimated response is determined to exceed the error tolerance threshold, update the hybrid model based on the difference.

12. The system of claim 10, wherein the downhole operation is a stimulation treatment, and the functions performed by the processor further include functions to:

determine whether the one or more locations at which the measurements were obtained correspond to a fracture within the formation;

when it is determined that the one or more locations correspond to a fracture within the formation:

designate one or more of a plurality of cells corresponding to the one or more locations within the simulation grid as a fractured region of the hybrid model; and assign at least one of a physics-based model or a machine learning model to the fractured region within the simulation grid; and when it is determined that the one or more locations do not correspond to a fracture within the formation, designate one or more of the plurality of cells corresponding to the one or more locations within the simulation grid as a non-fractured region of the hybrid model.

13. The system of claim 12, wherein the physics-based model is at least one of a finite difference (FD) model or a smoothed particle hydrodynamics (SPH) model.

14. The system of claim 12, wherein the machine learning model is a neural network.

15. The system of claim 14, wherein the neural network is at least one of a recurrent deep neural network (DNN) or a long short-term memory (LSTM) deep neural network.

16. The system of claim 14, wherein the functions performed by the processor further include functions to:

train the neural network to estimate the response of the one or more operating variables to fluid injection, based on a portion of the measurements obtained during the current stage of the stimulation treatment and a cost function associated with each of the one or more operating variables;

determine an actual response of the one or more operating variables, based on additional measurements obtained during the subsequent stage of the stimulation treatment along the wellbore;

determine whether a difference between the actual response and the estimated response exceeds an error tolerance threshold; and when the difference is determined to exceed the error tolerance threshold, retrain the neural network using the additional measurements.

17. The system of claim 16, wherein the functions performed by the processor further include functions to:

apply Bayesian optimization to retrain the neural network over a plurality of iterations until a predetermined convergence criterion is met.

18. The system of claim 16, wherein the functions performed by the processor further include functions to:

determine boundary conditions for an interface between the fractured and non-fractured regions of the hybrid model, wherein the fluid flow is simulated for the subsequent stage of the downhole operation, based on the determined boundary conditions.

19. A non-transitory computer-readable storage medium having instructions stored therein, which, when executed by a computer, cause the computer to perform a plurality of functions, including functions to:

obtain, from a downhole tool disposed in a wellbore within a formation, measurements of an operating variable at one or more locations within the formation during a current stage of a downhole operation being performed along the wellbore;

apply the obtained measurements as inputs to a hybrid model of the formation, the hybrid model including physics-based and machine learning models that are coupled together within a simulation grid;

simulate fluid flow within the formation, based on the inputs applied to the hybrid model;

estimate a response of the operating variable for a subsequent stage of the downhole operation to be performed along the wellbore, based on the simulation;

determine flow control parameters for the subsequent stage of the downhole operation to be performed, based on the estimated response; and perform the subsequent stage of the downhole operation according to the determined flow control parameters.

20. The non-transitory computer-readable storage medium of claim 19, wherein the functions performed by the computer further include functions to:

monitor an actual response of the operating variable, based on additional measurements obtained from the downhole tool as the subsequent stage of the downhole operation is performed along the wellbore;

determine whether a difference between the actual response and the estimated response exceeds an error tolerance threshold; and when a difference between the actual response and the estimated response is determined to exceed the error tolerance threshold, update the hybrid model based on the difference.

\* \* \* \* \*